(12) United States Patent
Futakuchi et al.

(10) Patent No.: US 10,330,708 B2
(45) Date of Patent: Jun. 25, 2019

(54) CURRENT DETECTION DEVICE AND CORRECTION FACTOR CALCULATION METHOD

(71) Applicant: Hitachi Metals, Ltd., Tokyo (JP)

(72) Inventors: Naoki Futakuchi, Tokyo (JP); Katsuya Akimoto, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/749,747

(22) PCT Filed: Jan. 7, 2016

(86) PCT No.: PCT/JP2016/050302
§ 371 (c)(1),
(2) Date: Feb. 1, 2018

(87) PCT Pub. No.: WO2017/119092
PCT Pub. Date: Jul. 13, 2017

(65) Prior Publication Data
US 2018/0224483 A1    Aug. 9, 2018

(51) Int. Cl.
*G01R 15/20* (2006.01)
*G01R 19/00* (2006.01)
*G01R 35/00* (2006.01)

(52) U.S. Cl.
CPC .......... *G01R 15/20* (2013.01); *G01R 15/207* (2013.01); *G01R 19/0092* (2013.01); *G01R 35/005* (2013.01)

(58) Field of Classification Search
CPC ..... G01R 15/207; G01R 15/205; G01R 15/25
See application file for complete search history.

(56) References Cited

U.S. PATENT DOCUMENTS 6,583,613 B1    6/2003    Hohe et al.
2006/0082357 A1*    4/2006    Tsukamoto ............ G01R 15/20
324/126

(Continued)

FOREIGN PATENT DOCUMENTS

JP    2004-507747 A    3/2004
WO    WO 00/54063 A1    9/2000

OTHER PUBLICATIONS

Notification of Transmittal of Translation of the International Preliminary Report on Patentability (PCT Form PCT/IB/338), in PCT/JP2016/050302, dated Jul. 19, 2018.

(Continued)

*Primary Examiner* — Jermele M Hollington
*Assistant Examiner* — Alvaro E Fortich
(74) *Attorney, Agent, or Firm* — McGinn IP Law Group, PLLC.

(57) ABSTRACT

A current detection device includes plural bus bars, plural magnetic detection elements that are arranged respectively corresponding to the bus bars, a magnetic shield arranged to surround parts of the bus bars and the magnetic detection elements, a correction factor calculation unit that, on the basis of voltages output from the magnetic detection elements when any two or more of the bus bars are supplied with inversely phased currents, calculates correction factors for correcting mutual interference between the magnetic detection elements, a recording medium that holds the correction factors calculated by the correction factor calculation unit, and a current calculation unit that, using the correction factors held in the recording medium, calculates the currents flowing through the bus bars on the basis of the voltages output from the magnetic detection elements.

4 Claims, 5 Drawing Sheets

(56) References Cited

U.S. PATENT DOCUMENTS

2008/0094060 A1* 4/2008 Muraki ................ B82Y 25/00
324/252
2010/0026286 A1* 2/2010 Koss .................... G01R 15/207
324/244

OTHER PUBLICATIONS

International Preliminary Report on Patentability (PCT Form PCT/IB/373), in PCT/JP2016/050302, dated Jul. 10, 2018.
Translation of Written Opinion of the International Searching Authority (PCT Form PCT/ISA/237), in PCT/JP2016/050302.
International Search Report (ISR) (PCT Form PCT/ISA/210), in PCT/JP2016/050302, dated Apr. 5, 2016.

* cited by examiner

CURRENT DETECTION DEVICE AND CORRECTION FACTOR CALCULATION METHOD

TECHNICAL FIELD

The present invention relates to a current detection device and a correction factor calculation method.

BACKGROUND ART

An electric current measuring device has been proposed which has a conductor array composed of conductors arranged adjacent to each other but can accurately detect a current flowing through one of the conductors (see, e.g., Patent Literature 1 below).

The electric current measuring device described in Patent Literature 1 below is provided with a readout unit for reading output signals from four magnetic sensors arranged to sandwich each of the three parallel conductors of the conductor array, and a computing unit for calculating currents respectively flowing through the conductors based on the output signals read by the readout unit as well as a correction factor representing an effect of a predetermined magnetic field on the output signal from each magnetic sensor. The correction factor used for computing in the computing unit is pre-calculated by passing an electric current through only one conductor without passing through the other conductors, and is recorded.

PRIOR ART LITERATURE

Patent Literature

Patent Literature 1: JP 2004-507747 A

SUMMARY OF INVENTION

Technical Problem

However, the electric current measuring device described in the above Patent Literature 1 has a problem that when a magnetic shield is present near the conductors, the output signals from the magnetic sensors are affected by a magnetic field of the magnetic shield and it is thus not possible to accurately calculate the correction factor.

Thus, it is an object of the invention to provide a current detection device and a correction factor calculation method by which currents flowing through bus bars covered with a magnetic shield can be detected with high accuracy.

Solution to Problem

To achieve the above-mentioned object, the invention provides a current detection device comprising: a plurality of bus bars; a plurality of magnetic detection elements that are arranged respectively corresponding to the plurality of bus bars, detect strength of magnetic fields generated by currents flowing through the bus bars and output voltages corresponding to the strength of magnetic fields; a magnetic shield arranged to surround parts of the plurality of bus bars and the plurality of magnetic detection elements; a correction factor calculation unit that, on the basis of the voltages output from the plurality of magnetic detection elements when any two or more of the plurality of bus bars are supplied with inversely phased currents, calculates correction factors for correcting mutual interference between the plurality of magnetic detection elements; a recording medium that holds the correction factors calculated by the correction factor calculation unit; and a current calculation unit that, using the correction factors held in the recording medium, calculates the currents flowing through the plurality of bus bars on the basis of the voltages output from the plurality of magnetic detection elements.

Advantageous Effects of Invention

According to the invention, it is possible to highly accurately detect electric currents flowing through bus bars even in a configuration in which the bus bars are covered with a magnetic shield.

DESCRIPTION OF EMBODIMENT

An embodiment of the invention will be described below in reference to FIGS. 1 to 9.

Figure 1:
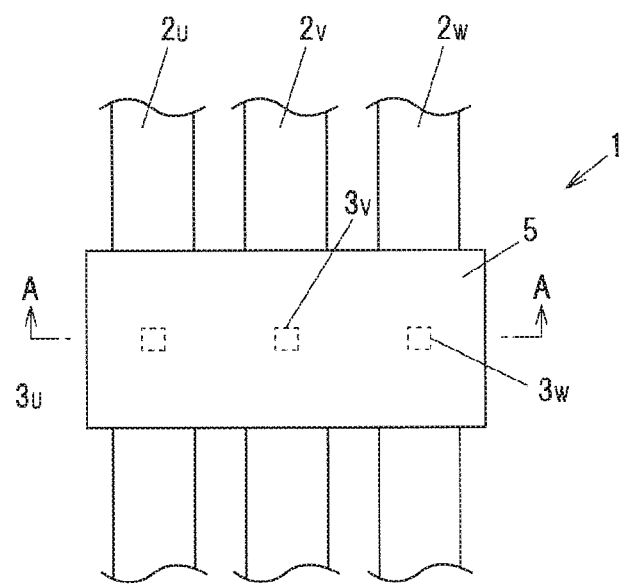
FIG. 1 is a plan view showing a main portion of a current detection device in an embodiment of the present invention.
Figure 2:
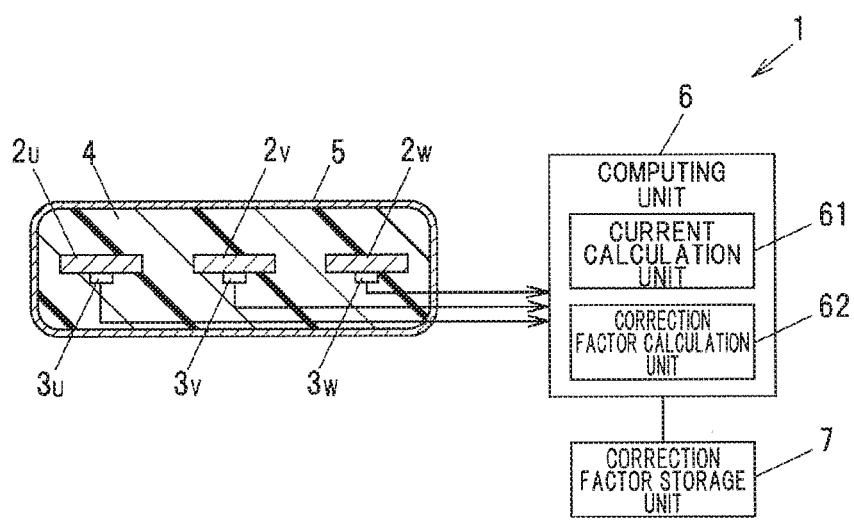
FIG. 2 is a cross sectional view taken along a line A-A in FIG. 1.

FIG. 1 is a plan view showing a main portion of a current detection device in an embodiment of the invention. FIG. 2 is a cross sectional view taken along the line A-A in FIG. 1. In FIG. 1, a computing unit and a correction factor storage unit (which are described later) are not shown.

As shown in FIGS. 1 and 2, a current detection device 1 is provided with plural (three for three phases in the present embodiment) bus bars $2u$, $2v$ and $2w$ (hereinafter, also generically referred to as "bus bar 2") which are arranged in parallel, plural (three in the present embodiment) magnetic detection elements $3u$, $3v$ and $3w$ (hereinafter, also generically referred to as "magnetic detection element 3") which are arranged respectively corresponding to the three bus bars 2u, 2v and 2w, detect strength of magnetic fields generated by electric currents flowing through the bus bars 2u, 2v and 2w, and output voltages corresponding to the detected strength of magnetic fields, a molded resin portion 4 covering portions of the three bus bars 2u, 2v and 2w and the three magnetic detection elements 3u, 3v and 3w, a magnetic shield 5 covering the molded resin portion 4, a computing unit 6 which calculates electric currents respectively flowing through the bus bars 2u, 2v and 2w based on the voltages output from the three magnetic detection elements 3u, 3v and 3w, and a correction factor storage unit 7 which stores correction factors. The correction factor storage unit 7 is one aspect of the "recording medium" of the invention.

The bus bars 2 are formed of plate-shaped conductors and serve as current paths for carrying three-phase motor currents between, e.g., a motor as a drive source for running a vehicle and an inverter. The electric current flowing through the bus bar 2 is, e.g., up to about 200 A in a steady state and up to about 800 A of inrush current in an abnormal state, etc., with a frequency of, e.g., up to 100 kHz. The three bus bars 2 are arranged in the same plane and aligned at equal intervals in a width direction so that the longitudinal directions thereof are parallel to each other. When an electric current flows through the bus bar, a magnetic field is generated in a direction orthogonal to the direction of the electric current and the strength thereof diminishes with an increase in distance from the bus bar.

The magnetic detection element 3 is configured to output a voltage corresponding to strength of magnetic field (magnetic flux density) in a direction along a detection axis. As the magnetic detection element 3, it is possible to use, e.g., an MR (Magneto Resistance) sensor such as GMR (Giant Magneto Resistive effect) sensor. In the present embodiment, GMR sensors with relatively high sensitivity are used. Since a magnetic field to be detected by the magnetic detection element 3 is different depending on, e.g., the position thereof relative to the bus bar 2, the output is different even when the magnitude of the electric current flowing through the corresponding bus bar is the same.

The magnetic detection element 3 is arranged, e.g., in contact with or close to the bus bar 2. The orientation of the magnetic detection element 3 is such that the detection axis thereof is desirably orthogonal to the longitudinal direction of the bus bar 2 but may be inclined from the orthogonal direction. Alternatively, the magnetic detection element 3 may be arranged in a through-hole formed on the bus bar 2.

The molded resin portion 4 is formed of, e.g., a highly electrically insulating epoxy resin, etc.

A single magnetic shield 5 shields all the three bus bar 2 to eliminate the effect of disturbance caused by an external magnetic field. The magnetic shield 5 is formed of, e.g., a soft magnetic material such as permalloy, magnetic steel sheet or ferrite. Since a relative magnetic permeability of the magnetic shield 5 is much greater than 1 (in general, not less than 1000), the magnetic flux of the disturbance magnetic field is drawn toward the magnetic shield 5 and strength of magnetic field at the location of the magnetic detection element 3 thus can be reduced (the disturbance shielding effect).

In addition, the magnetic flux of the magnetic field generated when applying an electric current to the bus bar 2 is also drawn toward the magnetic shield 5. The relative magnetic permeability of the magnetic shield 5 changes due to its internal magnetic field. For example, with an increase in the magnetic field inside the magnetic shield 5, the change in the magnetic flux density with respect to the change in the magnetic field becomes smaller (so-called saturation) and the relative magnetic permeability decreases. When the relative magnetic permeability of the magnetic shield 5 changes, the extent of drawing the magnetic flux toward the magnetic shield 5 changes, leading to a change in the magnetic field strength at the location of the magnetic detection element 3. Meanwhile, when electric currents are applied to two or more of the bus bars 2, the magnetic flux inside the magnetic shield 5 is the superposition of the respective effects of the two or more bus bars.

The magnetic shield 5 is provided to surround the bus bars 2, but does not necessarily need to have a closed shape and may have a space of certain size. Furthermore, the configuration may be such that flat plates are arranged in parallel so as to sandwich the bus bars 2 therebetween.

The computing unit 6 is provided with a current calculation unit 61 which obtains a magnetic flux density based on the voltage output from the magnetic detection element 3 using a relational expression associating magnetic flux density with voltage and calculates a current flowing through each bus bar 2 based on the obtained magnetic flux density, and a correction factor calculation unit 62 which calculates a correction factor used to correct interference between the magnetic detection elements 3. The computing unit 6 can be realized by an integrated circuit (IC), e.g., an ASIC (Application Specific Integrated Circuit) or an FPGA (Field Programmable Gate Array), etc.

The current calculation unit 61 calculates a current flowing through each bus bar 2 by using, e.g., the following formula (1).

$$\begin{pmatrix} I_u \\ I_v \\ I_w \end{pmatrix} = \begin{pmatrix} a_{11} & a_{12} & a_{13} \\ a_{21} & a_{22} & a_{23} \\ a_{31} & a_{32} & a_{33} \end{pmatrix} \begin{pmatrix} B_u \\ B_v \\ B_w \end{pmatrix} = \begin{pmatrix} a_{11} & a_{12} & a_{13} \\ a_{21} & a_{22} & a_{23} \\ a_{31} & a_{32} & a_{33} \end{pmatrix} \begin{pmatrix} f_u(V_u) \\ f_v(V_v) \\ f_w(V_w) \end{pmatrix} \quad (1)$$

where Vu, Vv and Vw are voltages respectively output from the magnetic detection elements 3u, 3v and 3w, Bu, Bv and Bw are magnetic flux densities converted from the voltages of the respective phases using functions fu, fv and fw, $a_{11}$ to $a_{33}$ are correction factors, and Iu, Iv and Iw are electric currents respectively flowing through the bus bars 2u, 2v and 2w. Iu, Iv and Iw may alternatively be voltages proportional to the electric currents respectively flowing through the bus bars 2u, 2v and 2w.

The correction factor storage unit 7 is, e.g., EEPROM which is a non-volatile memory, and stores the correction factors $a_{11}$ to $a_{33}$ for correcting interference between the magnetic detection elements 3.

The correction factor calculation unit 62 calculates an optimal correction factor which is then stored in the correction factor storage unit 7. Then, the current calculation unit 61 plugs the correction factor stored in the correction factor storage unit 7 into the formula (1) and calculates an electric current flowing through each bus bar 2.

Figure 3:
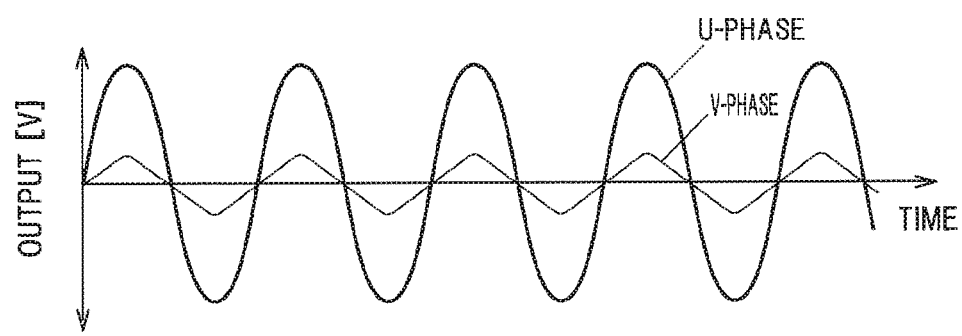
FIG. 3 is a graph showing a measurement result of voltage outputs of magnetic detection elements when an electric current is applied to only the U-phase.
Figure 4:
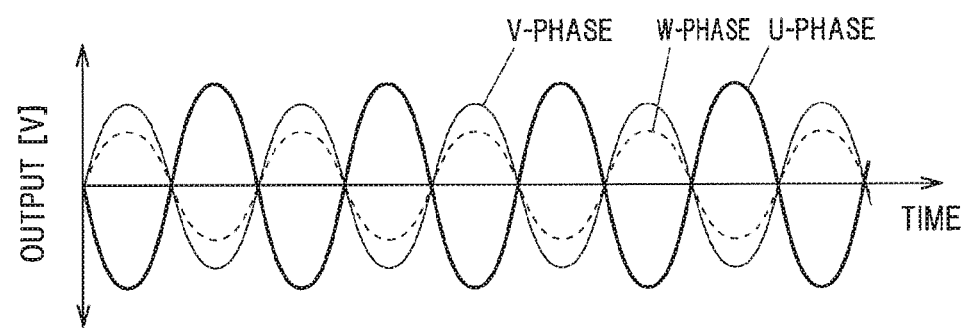
FIG. 4 is a graph showing a measurement result of voltage outputs of the magnetic detection elements when electric currents are applied to the U-phase and the V-phase.

FIG. 3 is a graph showing a measurement result of outputs when an electric current is applied to only the U-phase. FIG. 4 is a graph showing a measurement result of outputs when electric currents are applied to the U-phase and the V-phase.

The magnetic detection elements 3 are located close to each other and thus are each affected by the other phases which are different from own phase (mutual interference). Thus, each magnetic detection element 3 detects a combined magnetic field produced by the magnetic fields respectively generated by the electric currents flowing through the bus bars 2. Therefore, to accurately calculate individual electric currents flowing through the bus bars 2, it is necessary to correct interference by using a correction factor.

However, when the bus bars 2 and the magnetic detection elements 3 are covered with the magnetic shield 5, the magnetic fields generated by the electric currents passing through the bus bars 2 penetrate into the magnetic shield 5 and, depending on the magnitude thereof, causes a change in permeability of the magnetic shield 5. When the variation range of such magnetic fields is large, the relative magnetic permeability of the magnetic shield 5 changes with variation of the magnetic fields and the voltage outputs of the magnetic detection elements 3 thus change non-linearly.

When an electric current is applied to only one bus bar 2, the magnetic field generated around the current-carrying bus bar 2 greatly varies depending on the electric current in the current-carrying bus bar 2. Since the magnetic field inside the magnetic shield 5 also greatly varies with such variation, the relative magnetic permeability of the magnetic shield 5 changes with the change of the electric current, and the output voltages of the magnetic detection elements 3 corresponding to the bus bars 2 other than the current-carrying bus bar 2 thus become non-linear. Meanwhile, the output voltage of the magnetic detection element 3 corresponding to the current-carrying bus bar 2 is less likely to be affected by the change in the relative magnetic permeability of the magnetic shield 5 and the output is linear since the magnetic detection element 3 is located close to the bus bar 2. For example, when an electric current is applied to only the U-phase, the output voltage of the U-phase magnetic detection element 3u becomes linear and the output voltage of the V-phase magnetic detection element 3v, on the other hand, becomes non-linear, as shown in FIG. 3. If an interference correction factor is calculated under such conditions, it is not possible to obtain an accurate correction factor.

Meanwhile, when electric currents with substantially identical amplitudes but opposite phases are applied to given two of the bus bars 2, the magnetic field around the bus bars 2 is the superposition of the magnetic fields generated by applying the electric currents to the two bus bars 2. The magnetic field generated inside the magnetic shield 5 is also the superposition and, especially with substantially identical amplitudes but opposite phases, the respective effects cancel each other out and variation in the magnetic fields can thereby be reduced. The relative magnetic permeability of the magnetic shield 5 thus hardly changes and the output voltages of the magnetic detection elements 3 become linear. For example, when electric currents with substantially identical amplitudes but opposite phases are applied to the U-phase and the V-phase, a relation between the output voltages of the three-phase magnetic detection elements 3 becomes linear, as shown in FIG. 4. When calculating an interference correction factor under such conditions, it is possible to obtain an accurate correction factor.

That is, in the present embodiment, to highly accurately measure electric currents flowing through the bus bars 2, electric currents with substantially identical amplitudes but opposite phases are applied to given two phases in a state that the magnetic shield 5 is provided. As a result, variation in the magnetic field of the magnetic shield 5 can be minimized, the output voltages of the magnetic detection elements 3 become linear, and it is thus possible to calculate an accurate correction factor. The key point for obtaining a correction factor is to reduce the amplitude of the sum of the electric currents applied to the bus bars 2 arranged inside the magnetic shield 5. Therefore, for example, even when electric currents are simultaneously applied to the three phases of the bus bars 2, the effects of the invention are obtained as long as the amplitude of the sum of the electric currents is small. As a result, in the present embodiment, it is possible to highly accurately correct interference between the magnetic detection elements 3.

(Method for Calculating the Correction Factor)

Next, a method for calculating a correction factor will be described. When measuring three-phase currents, the correction factors are arranged in a 3×3 matrix and three independent measurements are required to uniquely specify all factors. For example, electric currents with substantially identical amplitudes but opposite phases are applied to the U-phase and the V-phase, and the output voltages of the magnetic detection elements 3 are measured. Next, with a combination of the U-phase, the V-phase and the W-phase, a reference is applied to the V-phase while electric currents in phase opposite with respect to the V-phase are applied to the U-phase and the W-phase so that the sum of the amplitudes is substantially the same as the V-phase, and the output voltages of the magnetic detection elements 3 are measured. Then, electric currents with substantially identical amplitudes but opposite phases are applied to the W-phase and the U-phase, and the output voltages of the magnetic detection elements 3 are measured. This allows for calculation of a highly accurate correction factor. When the two electric currents in phase opposition are applied to the two bus bars 2 corresponding to given two or more phases, the currents are preferably applied so that after summing the currents in the same phase, an amplitude difference therebetween is not more than $1/10$ of the larger amplitude to calculate a correction factor with high accuracy.

Firstly, amplitudes of the voltages $V_{uo\_i}$, $V_{vo\_i}$ and $V_{wo\_i}$ output from the magnetic detection elements $3u$, $3v$ and $3w$ are obtained under the condition (i) that a reference current Iu is applied to the U-phase bus bar $2u$ and a current Iv (=−Iu) with a substantially identical amplitude but the opposite phase to the U-phase is applied to the V-phase bus bar $2v$. Amplitudes of the electric currents (reference currents) $I_{uo\_i}$, $I_{vo\_i}$, and $I_{wo\_i}$, flowing through the bus bars $2u$, $2v$ and $2w$ during when applying the reference current Iu to the U-phase bus bar $2u$ are also measured ($I_{wo\_i}$ is zero).

Next, voltages $V_{uo\_ii}$, $V_{vo\_ii}$ and $V_{wo\_ii}$ output from the magnetic detection elements $3u$, $3v$ and $3w$ are obtained under the condition (ii) that a reference current Iv is applied to the V-phase bus bar $2v$, a current Iu (=−kIv) with an amplitude k times (0<k<0.5) that of the V-phase and the opposite phase is applied to the U-phase bus bar $2u$ and a current Iw (=−kIv) with an amplitude k times (0<k<0.5) that of the V-phase and the opposite phase is applied to the W-phase bus bar $2v$. Amplitudes of the electric currents (reference currents) $I_{uo\_ii}$, $I_{vo\_ii}$ and $I_{wo\_ii}$ flowing through the bus bars $2u$, $2v$ and $2w$ during when applying the reference current Iv to the V-phase bus bar $2v$ are also measured.

Next, voltages $V_{uo\_iii}$, $V_{vo\_iii}$ and $V_{wo\_iii}$ output from the magnetic detection elements $3u$, $3v$ and $3w$ are obtained under the condition (iii) that a reference current Iw is applied to the W-phase bus bar $2w$ and a current Iv (=−Iw) with a substantially identical amplitude and the opposite phase to the W-phase is applied to the V-phase bus bar $2v$. Amplitudes of the electric currents (reference currents) $I_{uo\_iii}$, $I_{vo\_iii}$ and $I_{wo\_iii}$ flowing through the bus bars $2u$, $2v$ and $2w$ during when applying the reference current Iw to the W-phase bus bar $2w$ are also measured ($I_{uo\_iii}$ is zero).

The obtained voltages $V_{uo\_i}$, $V_{vo\_i}$, $V_{wo\_i}$, $V_{uo\_ii}$, $V_{vo\_ii}$, $V_{wo\_ii}$, $V_{vo\_iii}$ and $V_{wo\_iii}$ and currents $I_{uo\_i}$, $I_{vo\_i}$, $I_{wo\_i}$, $I_{uo\_ii}$, $I_{vo\_ii}$, $I_{wo\_ii}$, $I_{uo\_iii}$, $I_{vo\_iii}$, and $I_{wo\_iii}$ are plugged into the following formula (2).

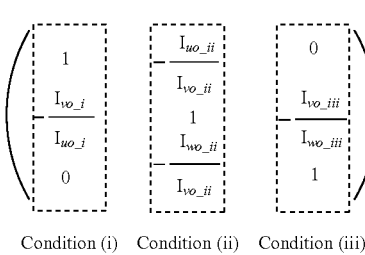

Condition (i)  Condition (ii)  Condition (iii)

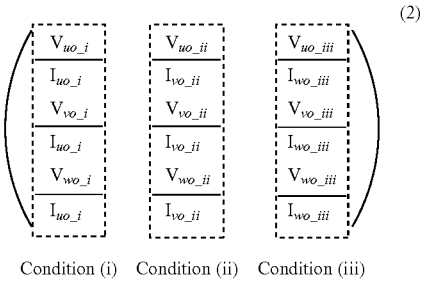

Condition (i)  Condition (ii)  Condition (iii)

(2)

The formula (2) can be expressed as:

$$I_N = GAV_G \quad (3)$$

where $I_N$ is a current amplitude matrix on the left-hand side of the formula (2), G is a factor (scalar value) for converting a voltage value as factor 1 on the right-hand side into a current value, A is an interference correction factor matrix as factor 2, and $V_G$ is an output gradient matrix as factor 3. The current amplitudes in the current amplitude matrix $I_N$ are obtained by normalizing the measured current amplitudes to the reference current. The voltage amplitudes in the output gradient matrix $V_G$ are obtained by normalizing the output voltage amplitudes to the reference current.

The formula (3) can be modified to the following formula (4):

$$A = (1/G) I_N V_G^{-1} \quad (4)$$

When $V_G$ has an inverse (when the three conditions are independent), the interference correction factors $a_{uu}$, $a_{uv}$, $a_{uw}$, $a_{vu}$, $a_{vv}$, $a_{vw}$, $a_{wu}$, $a_{wv}$ and $a_{ww}$ can be obtained from the formula (4).

(Functions and Effects of the Embodiment)

In the present embodiment, the following functions and effects are obtained.

(1) The bus bars 2 and the magnetic detection elements 3 are shielded by the magnetic shield 5 and are thus less likely to be affected by disturbance magnetic field.

To calculate a correction factor, electric currents with substantially identical amplitudes (after summing the amplitudes of the same phase) but opposite phases are applied to any two or more of the three phases in a state that the bus bars 2 and the magnetic detection elements 3 are shielded by the magnetic shield 5. Therefore, the magnetic fields generated by the electric currents applied to the respective phases cancel each other out, which results in that variation in the relative magnetic permeability of the magnetic shield 5 is minimized, the output voltages of the magnetic detection elements 3 become linear, and it is thus possible to calculate an accurate correction factor. As a result, it is possible to highly accurately correct interference, and it is possible to highly accurately detect electric currents flowing through the bus bars 2 in a configuration in which the bus bars 2 are covered with the magnetic shield 5.

EXAMPLES

Figure 5:
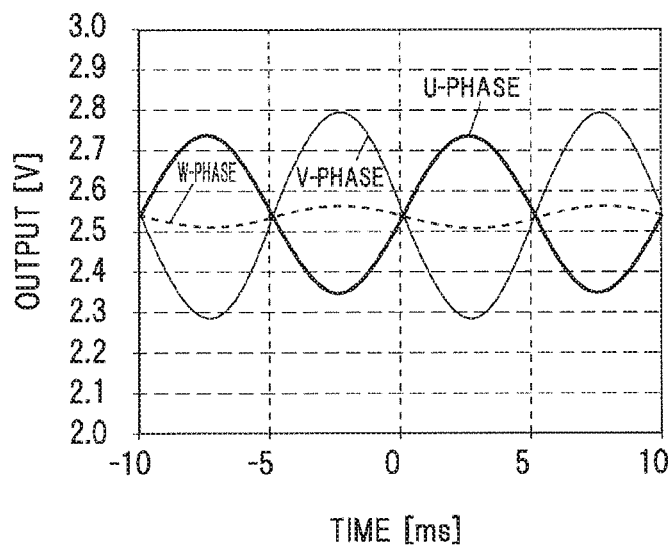
FIG. 5 is a graph showing a measurement result of voltage outputs of the magnetic detection elements when electric currents with substantially identical amplitudes are applied to the U-phase and the V-phase in opposite directions to each other.
Figure 6:
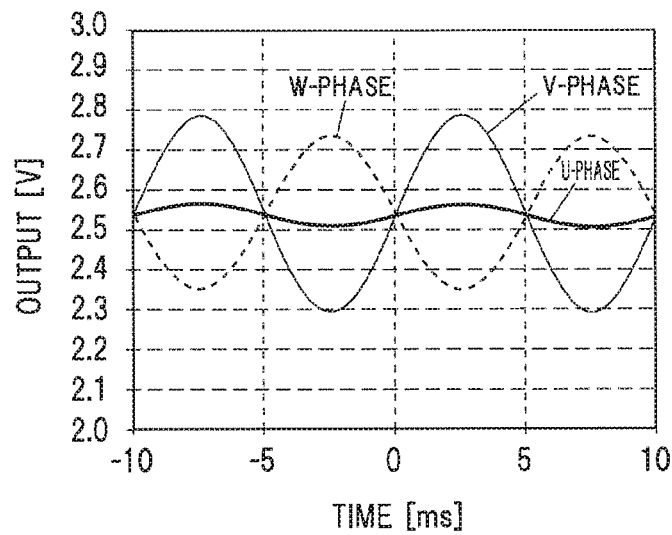
FIG. 6 is a graph showing a measurement result of voltage outputs of the magnetic detection elements when electric currents with substantially identical amplitudes are applied to the V-phase and the W-phase in opposite directions to each other.
Figure 7:
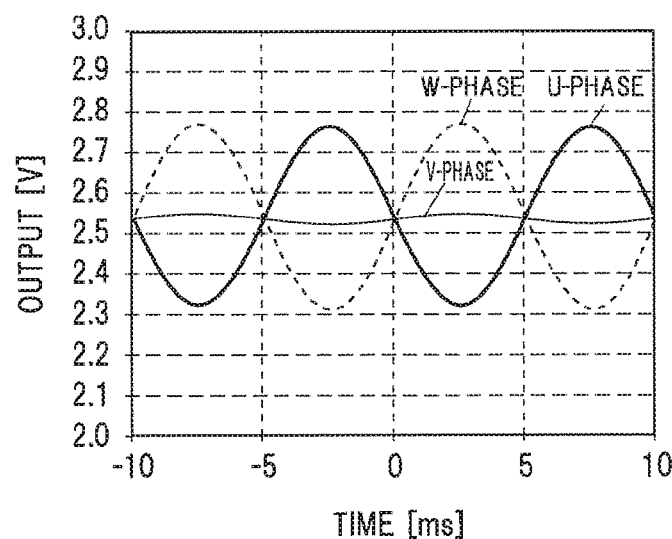
FIG. 7 is a graph showing a measurement result of voltage outputs of the magnetic detection elements when electric currents with substantially identical amplitudes are applied to the W-phase and the U-phase in opposite directions to each other.

FIGS. 5, 6 and 7 are graphs for explaining a procedure for calculating the interference correction factor matrix. FIG. 5 is a graph showing a measurement result of voltage outputs of the magnetic detection elements 3 when electric currents with substantially identical amplitudes but opposite phases are applied to the U-phase and V-phase bus bars. FIG. 6 is a graph showing a measurement result of voltage outputs of the magnetic detection elements 3 when electric currents with substantially identical amplitudes but opposite phases are applied to the V-phase and W-phase bus bars. FIG. 7 is a graph showing a measurement result of voltage outputs of the magnetic detection elements 3 when electric currents with substantially identical amplitudes but opposite phases are applied to the W-phase and the U-phase bus bars.

As shown in FIG. 5, when the electric currents are applied to the U-phase and V-phase bus bars, the output voltages of the magnetic detection elements 3u and 3v have large sine waves, but the output voltage of the magnetic detection element 3w in the W-phase to which the electric current is not applied has a small sine wave. As shown in FIG. 6, when the electric currents are applied to the V-phase and W-phase bus bars, the output voltages of the magnetic detection elements 3v and 3w have large sine waves, but the output voltage of the magnetic detection element 3u in the U-phase to which the electric current is not applied has a small sine wave. As shown in FIG. 7, when the electric currents are applied to the W-phase and U-phase bus bars, the output voltages of the magnetic detection elements 3w and 3u have large sine waves, but the output voltage of the magnetic detection element 3v to which the electric current is not applied has a small sine wave. Since each output has a sine wave, the outputs of the magnetic detection elements 3 are linear and an interference correction factor can be obtained accurately by using the formula (4).

The following is an example of the correction factors.

$$\begin{pmatrix} a_{UU} & a_{UV} & a_{UW} \\ a_{VU} & a_{VV} & a_{VW} \\ a_{WU} & a_{WV} & a_{WW} \end{pmatrix} = \begin{pmatrix} 0.98459 & -0.20400 & -0.11447 \\ -0.00361 & 0.96458 & -0.04855 \\ -0.14465 & -0.20645 & 0.94812 \end{pmatrix}$$

Figure 8:
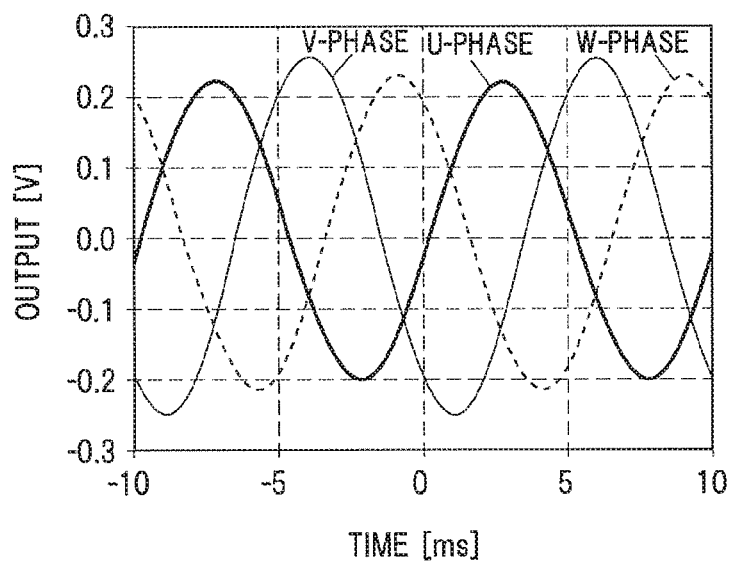
FIG. 8 is a measurement result of voltage outputs of the magnetic detection elements when electric currents are applied to the three phases and before a correction factor is applied.
Figure 9:
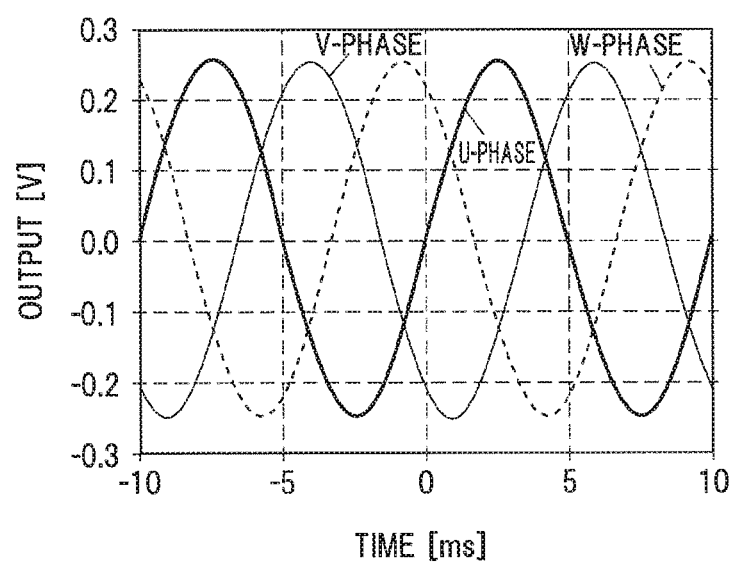
FIG. 9 is a measurement result of voltage outputs of the magnetic detection elements when electric currents are applied to the three phases and after are applied a correction factor is applied.

FIG. 8 is a measurement result of voltage outputs of the magnetic detection elements when electric currents with identical amplitudes are applied to the three-phase bus bars and before interference correction using the correction factors shown in the above formula is applied. FIG. 9 is a measurement result of voltage outputs of the magnetic detection elements when electric currents with identical amplitudes are applied to the three-phase bus bars and after interference correction using the correction factors shown in the above formula is applied. Even when the electric currents with identical amplitudes are applied to the three phases, an amplitude difference between the output voltages of the respective phases before applying correction is not less than 0.3V, as shown in FIG. 8. However, there is substantially no amplitude difference between the output voltages of the respective phases after applying correction, as shown in FIG. 9.

SUMMARY OF EMBODIMENTS

Technical ideas understood from the embodiment will be described below citing the reference numerals, etc., used for the embodiment. However, each reference numeral described below is not intended to limit the constituent elements in the claims to the members, etc., specifically described in the embodiment.

[1] A current detection device, comprising: a plurality of bus bars (2); a plurality of magnetic detection elements (3) that are arranged respectively corresponding to the plurality of bus bars (2), detect strength of magnetic fields generated by currents flowing through the bus bars (2) and output voltages corresponding to the strength of magnetic fields; a magnetic shield (5) arranged to surround parts of the plurality of bus bars (2) and the plurality of magnetic detection elements (3); a correction factor calculation unit (62) that, on the basis of the voltages output from the plurality of magnetic detection elements (3) when any two or more of the plurality of bus bars (2) are supplied with inversely phased currents, calculates correction factors for correcting mutual interference between the plurality of magnetic detection elements (3); a recording medium that holds the correction factors calculated by the correction factor calculation unit (62); and a current calculation unit (61) that, using the correction factors held in the recording medium, calculates the currents flowing through the plurality of bus bars (2) on the basis of the voltages output from the plurality of magnetic detection elements (3).

[2] The current detection device defined by [1], wherein, for calculation of the correction factors in the correction factor calculation unit (62), an amplitude difference between two current amplitudes, after summing the currents in the same phase among the inversely phased currents applied to the two or more bus bars (2), is not more than $\frac{1}{10}$ of the larger amplitude.

[3] A correction factor calculation method for a current detection device comprising a plurality of bus bars (2), a plurality of magnetic detection elements (3) that are arranged respectively corresponding to the plurality of bus bars (2), detect strength of magnetic fields generated by currents flowing through the bus bars (2) and output voltages corresponding to the strength of magnetic fields, and a magnetic shield (5) arranged to surround parts of the plurality of bus bars (2) and the plurality of magnetic detection elements (3), the method comprising: a step of calculating correction factors for correcting mutual interference between the plurality of magnetic detection elements (3) on the basis of the voltages output from the plurality of magnetic detection elements (3) when any two or more of the plurality of bus bars (2) are supplied with inversely phased currents.

[4] The correction factor calculation method defined by [3], wherein, in the step of calculating correction factors, an amplitude difference between two current amplitudes, after summing the currents in the same phase among the inversely phased currents applied to the two or more bus bars (2), is not more than $\frac{1}{10}$ of the larger amplitude.

Although the embodiment of the invention has been described, the invention according to claims is not to be limited to the embodiment. Further, please note that all combinations of the features described in the embodiment are not necessary to solve the problem of the invention.

In addition, the invention can be appropriately modified and implemented without departing from the gist thereof. For example, although the correction factors calculated by the correction factor calculation unit 62 are stored in the correction factor storage unit 7 in the embodiment, the correction factors may be recorded on a recording medium such as paper by printing, shopped as appended data of the current detection device 1 to a user, and stored in the correction factor storage unit 7 by the user. In addition, although three bus bars 2 are partially surrounded by the magnetic shield 5 at a longitudinal position in the embodiment, the number of the bus bars 2 may be more than three. In other words, the invention is applicable when detecting currents flowing through three or more bus bars 2 serving as conductive paths and partially surrounded by the magnetic shield 5 at a longitudinal position.

REFERENCE SIGNS LIST

1 CURRENT DETECTION DEVICE
2, $2u$, $2v$, $2w$ BUS BAR
3, $3u$, $3v$, $3w$ MAGNETIC DETECTION ELEMENT
4 MOLDED RESIN PORTION
5 MAGNETIC SHIELD
6 COMPUTING UNIT
7 CORRECTION FACTOR STORAGE UNIT
61 CURRENT CALCULATION UNIT
62 CORRECTION FACTOR CALCULATION UNIT

The invention claimed is:

1. A current detection device, comprising:
a plurality of bus bars;
a plurality of magnetic detection elements that are arranged respectively corresponding to the plurality of bus bars, detect strength of magnetic fields generated by currents flowing through the bus bars and output voltages corresponding to the strength of magnetic fields;
a magnetic shield arranged to surround parts of the plurality of bus bars and the plurality of magnetic detection elements;
a correction factor calculation unit that, on the basis of the voltages output from the plurality of magnetic detection elements when any two or more of the plurality of bus bars are supplied with inversely phased currents, calculates correction factors for correcting mutual interference between the plurality of magnetic detection elements;
a recording medium that holds the correction factors calculated by the correction factor calculation unit; and
a current calculation unit that, using the correction factors held in the recording medium, calculates the currents flowing through the plurality of bus bars on the basis of the voltages output from the plurality of magnetic detection elements.

2. The current detection device according to claim 1, wherein, for calculation of the correction factors in the correction factor calculation unit, an amplitude difference between two current amplitudes, after summing the currents in the same phase among the inversely phased currents applied to the two or more bus bars, is not more than $\frac{1}{10}$ of the larger amplitude.

3. A correction factor calculation method for a current detection device comprising a plurality of bus bars, a plurality of magnetic detection elements that are arranged respectively corresponding to the plurality of bus bars, detect strength of magnetic fields generated by currents flowing through the bus bars and output voltages corresponding to the strength of magnetic fields, and a magnetic shield arranged to surround parts of the plurality of bus bars and the plurality of magnetic detection elements, the method comprising:

a step of calculating correction factors for correcting mutual interference between the plurality of magnetic detection elements on the basis of the voltages output from the plurality of magnetic detection elements when any two or more of the plurality of bus bars are supplied with inversely phased currents.

4. The correction factor calculation method according to claim 3, wherein, in the step of calculating correction factors, an amplitude difference between two current amplitudes, after summing the currents in the same phase among the inversely phased currents applied to the two or more bus bars, is not more than $\frac{1}{10}$ of the larger amplitude.

\* \* \* \* \*